United States Patent
Muraoka et al.

(10) Patent No.: US 12,120,826 B2
(45) Date of Patent: Oct. 15, 2024

(54) MANAGEMENT APPARATUS AND MOUNTING SYSTEM

(71) Applicant: FUJI CORPORATION, Chiryu (JP)

(72) Inventors: Hiroo Muraoka, Nagoya (JP); Hideyuki Yamaguchi, Nagoya (JP); Takuji Goto, Kitanagoya (JP); Takuya Eki, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 364 days.

(21) Appl. No.: 17/441,359

(22) PCT Filed: Mar. 28, 2019

(86) PCT No.: PCT/JP2019/013791
§ 371 (c)(1),
(2) Date: Sep. 21, 2021

(87) PCT Pub. No.: WO2020/194710
PCT Pub. Date: Oct. 1, 2020

(65) Prior Publication Data
US 2022/0159887 A1  May 19, 2022

(51) Int. Cl.
*H05K 13/08* (2006.01)
(52) U.S. Cl.
CPC .................. *H05K 13/086* (2018.08)
(58) Field of Classification Search
CPC .. H05K 13/02; H05K 13/0417; H05K 13/084; H05K 13/085; H05K 13/0857;
(Continued)

(56) References Cited

U.S. PATENT DOCUMENTS

| | | | | |
|---|---|---|---|---|
| 2015/0074994 | A1* | 3/2015 | Maenishi | H05K 13/0419 29/832 |
| 2018/0376635 | A1* | 12/2018 | Iisaka | H05K 13/0417 |
| 2019/0150335 | A1* | 5/2019 | Kato | H05K 13/0061 29/832 |

FOREIGN PATENT DOCUMENTS

| | | |
|---|---|---|
| JP | 2001-127487 A | 5/2001 |
| JP | 2008-66404 A | 3/2008 |

(Continued)

OTHER PUBLICATIONS

JP 2008066404 translation provided by FIT database in SEARCH (Year: 2024).*

(Continued)

*Primary Examiner* — Aneeta Yodichkas
*Assistant Examiner* — Joshua D Anderson
(74) *Attorney, Agent, or Firm* — Oblon, McClelland, Maier & Neustadt, L.L.P.

(57) ABSTRACT

A management apparatus for an accommodation member that accommodates components to be mounted on a board includes a memory to reserve identification information on the accommodation member required for a production of the board to each arrangement position of the accommodation member in the mounting device, and to store reservation information defining an order of use of multiple accommodation members for each production at the same arrangement position according to the number of components required for the production; and a management section configured to set the accommodation member scheduled to be finally used at each arrangement position in each production of the board based on the reservation information as a final accommodation member, and to manage the final accommodation member and other accommodation members other than the final accommodation member based on (Continued)

the identification information on the accommodation members in a distinguishable manner for an operator.

9 Claims, 11 Drawing Sheets

(58) Field of Classification Search
CPC ............... H05K 13/086; H05K 13/087; H05K 13/0882; Y10T 29/4913; Y10T 29/53174; Y10T 29/53178
See application file for complete search history.

(56) References Cited

FOREIGN PATENT DOCUMENTS

| JP | 2008066404 A | * | 3/2008 |
| JP | 2012-104634 A | | 5/2012 |
| JP | 2016-139678 A | | 8/2016 |
| JP | 2017-50473 A | | 3/2017 |
| WO | WO 2014/068712 A1 | | 5/2014 |
| WO | WO 2019/038829 A1 | | 2/2019 |
| WO | WO-2019187009 A1 | * | 10/2019 |

OTHER PUBLICATIONS

WO-2019187009-A1 translation from FIT database (Year: 2024).*
International Search Report mailed on Jun. 18, 2019 in PCT/JP2019/013791 filed on Mar. 28, 2019 (2 pages).

* cited by examiner

MANAGEMENT APPARATUS AND MOUNTING SYSTEM

TECHNICAL FIELD

The present specification discloses a management apparatus and a mounting system.

BACKGROUND ART

Conventionally, in a mounting system including a mounting device that picks up components from an accommodation member such as a tape reel that accommodates the components and mounts the components on a board, a system that manages information on the accommodation member has been proposed (for example, refer to Patent Literature 1). In this mounting system, an exchange priority of the accommodation member is specified in an order of earliest component shortage and is displayed on a monitor, an operator seeing the monitor determines whether the prepared accommodation member is a preparation target accommodation member based on identification information on the prepared accommodation member, and handles the component shortage in the accommodation member by issuing an error warning if the prepared accommodation member is not the preparation target accommodation member.

PATENT LITERATURE

Patent Literature 1: JP-A-2008-66404

BRIEF SUMMARY

Technical Problem

Incidentally, in such a mounting system, in some cases, the accommodation members, in which the components are expected to remain before being used up, are planned to be reserved for use in the production of the next board. In this case, if the components of that accommodation member are not surely excessed, the accommodation member cannot be used as planned, which may interfere with the production.

The main object of the present disclosure is to perform the management of the accommodation members in which the components are expected to remain.

Solution to Problem

The present disclosure has taken following means to achieve the main object described above.

A management apparatus in the present disclosure is a management apparatus for an accommodation member that accommodates components to be mounted on a board by a mounting device. The apparatus includes: a memory section configured to reserve identification information on the accommodation member required for a production of the board to each arrangement position of the accommodation member in the mounting device, and to store reservation information defining an order of use of multiple accommodation members for each production at the same arrangement position according to the number of components required for the production; and a management section configured to set the accommodation member scheduled to be finally used at each arrangement position in each production of the board based on the reservation information as a final accommodation member, and to manage the final accommodation member and other accommodation members other than the final accommodation member based on the identification information on the accommodation members in a distinguishable manner for an operator.

The management apparatus in the present disclosure sets the accommodation member scheduled to be finally used at each arrangement position in each production of the board based on the reservation information as the final accommodation member, and manages the final accommodation member and other accommodation members other than the final accommodation member based on the identification information on the accommodation members in a distinguishable manner for an operator. In this way, it is possible to prevent the operator from erroneously handling the final accommodation member such as arranging the final accommodation member before other accommodation members. Therefore, in a case where the final accommodation member is reserved in the reservation information for another production, it is possible to prevent the change of the remaining number of components in the final accommodation member due to the operator's erroneous handling and the inconsistency with the reservation information. As a result, it is possible to more properly manage the accommodation member in which the components are expected to remain.

BRIEF DESCRIPTION OF DRAWINGS

FIG. 2 is an explanatory diagram illustrating an example of production plan information 54 including reservation information 54a.

DESCRIPTION OF EMBODIMENTS

Figure 1:
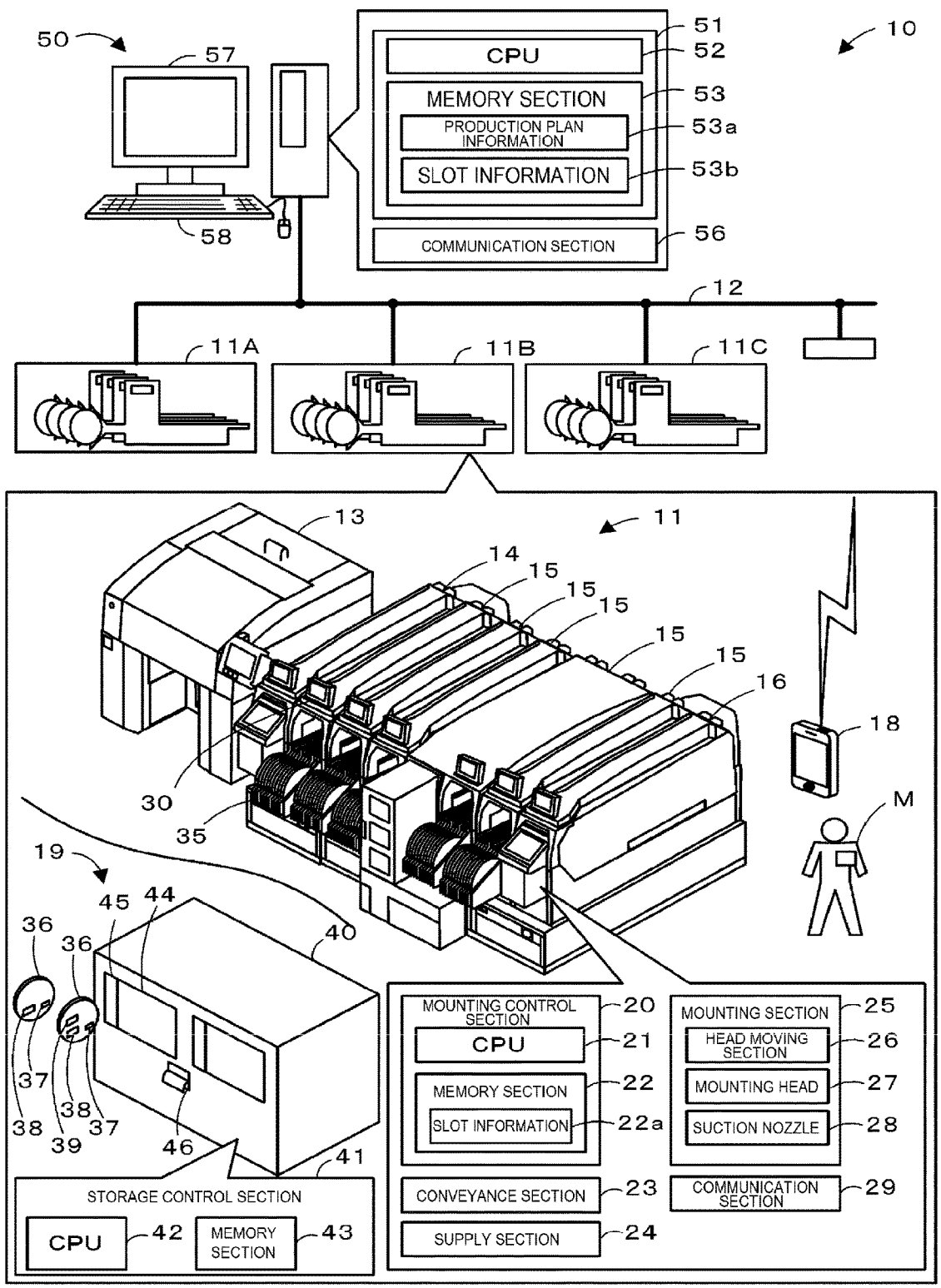
FIG. 1 is a configuration view illustrating an outline of a configuration of mounting system 10.

Next, an embodiment for the present disclosure will be described with reference to the drawings. FIG. 1 is a configuration view illustrating an outline of a configuration of mounting system 10 in the present embodiment. Mounting system 10 includes multiple mounting lines 11A to 11C that mount components on a board, network 12 such as a LAN, and management computer (PC) 50 connected to network 12 for managing information. Mounting lines 11A to 11C are referred to as mounting lines 11. Mounting system 10 includes printing device 13, printing inspection device 14, mounting device 15, mounting inspection device 16, a reflow device and a reflow inspection device (not illustrated), a board conveyance device, and the like. These are arranged in a production area of a factory. In addition to the production area, the factory has preparation area 19. Each mounting device 15 in the mounting line 11A is referred to as mounting devices 15A1, 15A2, 15A3, and the like in an order of arrangement. The same applies to other mounting lines 11B and 11C.

In preparation area 19, reel storage device 40 for storing reel 36 (accommodation member) that accommodates the components and is mounted on mounting device 15 are arranged. A tape accommodating the components is wound around reel 36. Reel storage device 40 is configured as an automatic warehouse that automatically accommodates reel 36 or automatically dispenses reel 36. This reel storage device 40 includes operation panel 44 for performing various inputs and displays, gate 45 which is an inlet and an outlet of reel 36, and label printer 46 for printing various labels attached to reel 36 or the like, in addition to an accommodation section for accommodating each reel 36. Reel storage device 40 may store the tape in a state of being separated from reel 36. Operator M performs an external setup work for assembling reel 36 picked from reel storage device 40 to feeder 35 and a work for mounting feeder 35 on the predetermined mounting device 15 before the start of production of the board. In addition, when new reel 36 arrives, operator M attaches ID label 37 indicating the identification ID to reel 36 at preparation area 19. ID label 37 may be a barcode or a two-dimensional code. Feeder 35 may store information on ID label 37 of attached reel 36. In addition, use location label 38 indicating a place where reel 36 is used and, if necessary, last reel label 39 indicating that reel 36 is the last reel may be attached to reel 36, in addition to ID label 37. Details of this last reel will be described later. When performing the work in mounting line 11 or preparation area 19, operator M possesses mobile terminal 18 that can read labels such as ID label 37. Mobile terminal 18 can exchange information with mounting device 15 and management computer 50 via network 12, and acquires and displays information on mounting line 11 and reel 36.

As illustrated in FIG. 1, mounting device 15 includes mounting control section 20, conveyance section 23, supply section 24, mounting section 25, communication section 29, and operation panel 30. Mounting control section 20 is configured as a microprocessor with CPU 21 as a center, and includes memory section 22 or the like configured to store various data. Mounting control section 20 exchanges information with conveyance section 23, supply section 24, mounting section 25, and communication section 29, and controls these sections. Conveyance section 23 is a unit that conveys and fixes the board. Supply section 24 is a unit that supplies components to mounting section 25. Supply section 24 includes, for example, a slot for mounting feeder 35 to which reel 36 in which a tape holding the components are wound is assembled. In addition, supply section 24 also includes a tray unit or the like that accommodates a tray on which components are placed. Mounting section 25 is a unit that picks up the components from supply section 24 and mounts the components on the board fixed to conveyance section 23. Mounting section 25 includes head moving section 26, mounting head 27, and suction nozzle 28. Head moving section 26 includes a slider to which mounting head 27 is detachably mounted and a motor that moves the slider along the guide rails. One or more suction nozzles 28 are detachably mounted on the lower surface of the mounting head 27. Suction nozzle 28 picks up the components by using negative pressure. In addition to suction nozzle 28, the components may be picked up by a mechanical chuck that mechanically holds the components or the like. Communication section 29 exchanges information with other devices via network 12. Operation panel 30 includes a display section as a display for displaying a screen and an operation section for receiving input from operator M.

Management computer 50 is a computer that manages information relating to a production process such as a mounting process and a production preparation process. Management computer 50 includes management control section 51, communication section 56, display section 57, input section 58, and the like. Management control section 51 is configured as a microprocessor with CPU 52 as a center, and includes memory section 53 and the like for storing various data. This management control section 51 exchanges information with communication section 56, display section 57, and input section 58, and controls these sections. Communication section 56 exchanges information with other devices via network 12. Management computer 50 exchanges information with each device of mounting line 11 connected to network 12 via communication section 56. Display section 57 is a display for displaying a screen. Input section 58 is a device such as a mouse or a keyboard for inputting an instruction by the operator.

Figure 2:
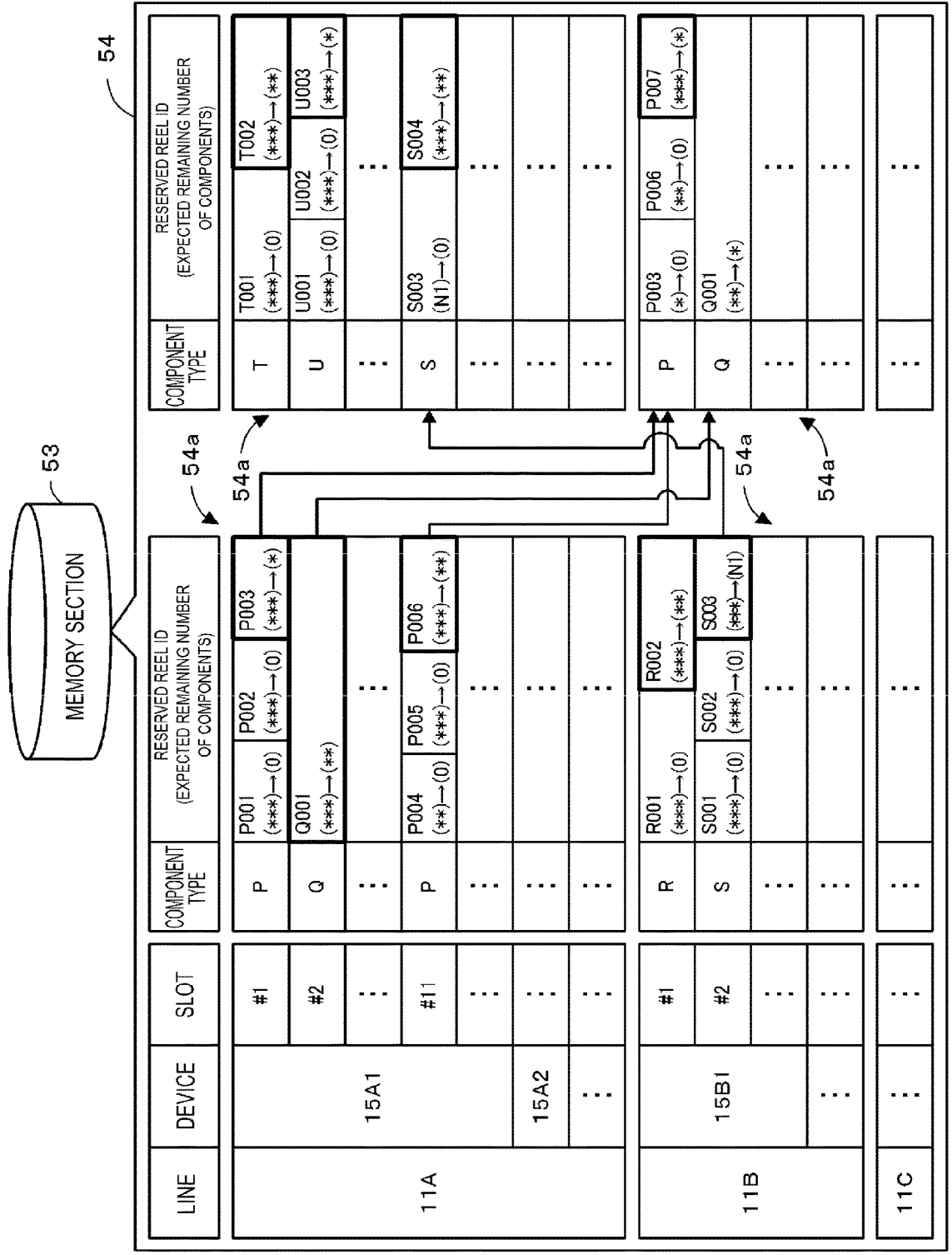
Figure 3:
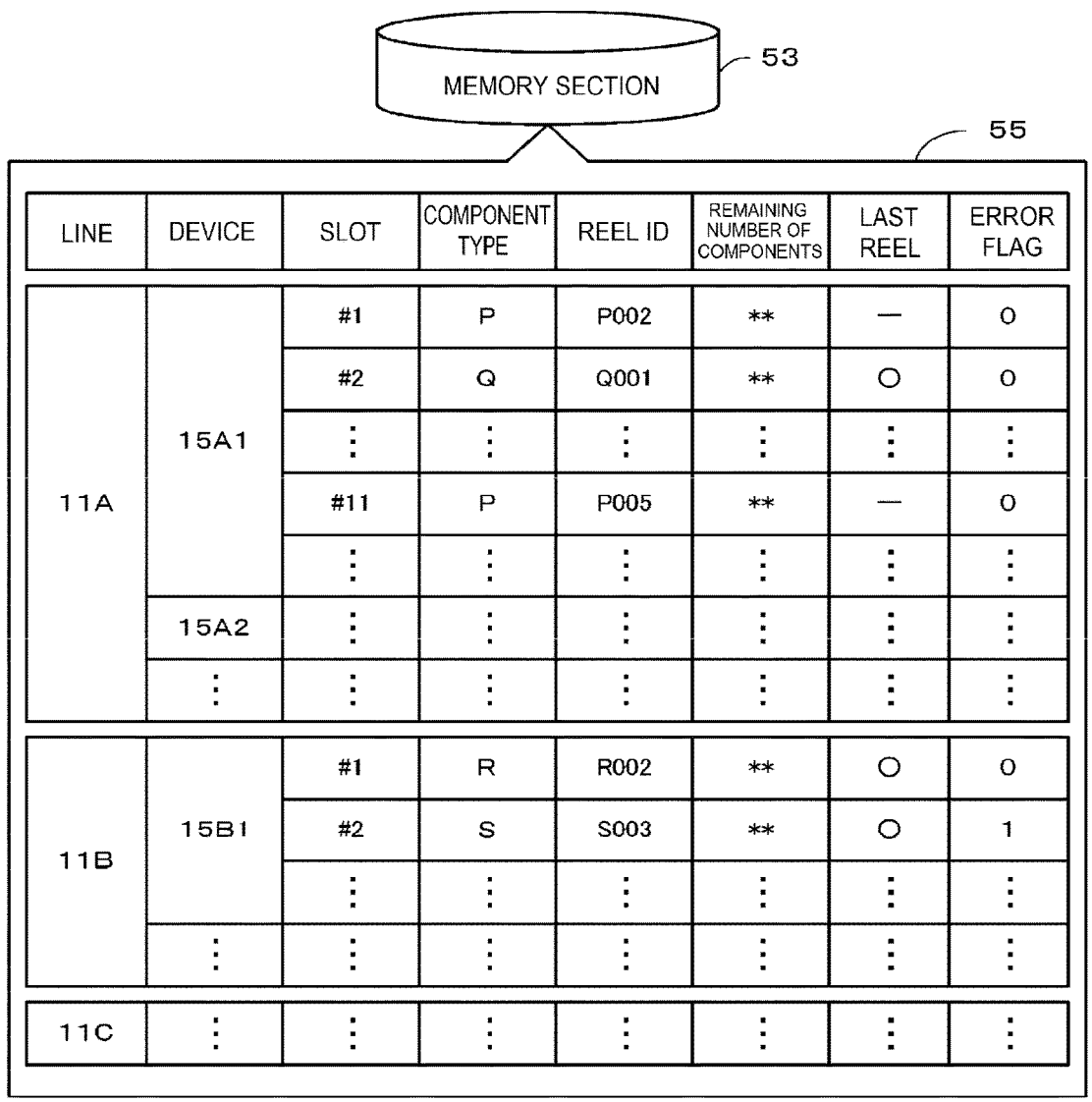
FIG. 3 is an explanatory diagram illustrating an example of slot information 55.

As illustrated in FIGS. 2 and 3, memory section 53 stores production plan information 54, slot information 55, and the like. Production plan information 54 is information including reservation information 54a on reel 36 (feeder 35) in the production of the board performed in mounting lines 11A to 11C within a predetermined period (for example, 3 days or 1 week). As for production plan information 54, reservation information 54a is created for each production based on a board manufacturing order (work order) from a customer, based on required component type, the number of components, inventory information on the components, and the like. Reservation information 54a includes information as to which slot of which device, reel 36 (feeder 35) of which component type is to be reserved, and information on the expected remaining number of components in reel 36 after use. In addition, in each production, if multiple reels 36 are used in one slot because the required number of components exceeds the number of accommodated components in reel 36, the order of using those reels 36 is also defined. In addition, reservation information 54a in production plan information 54 includes information as to reel 36 in which the components are left and reserved for the production of a certain board type will be reserved to which slot of which device next, and the like.

For example, in production plan information 54 in FIG. 2, in reservation information 54a corresponding to a certain production, reel 36 of component type P is used in slot #1 of mounting device 15A1 of mounting line 11A. It is illustrated that, in this slot #1, reels 36 having reel IDs P001, P002, and P003 are reserved in that order, and after the components of each reel 36 of P001 and P002 are used up in that order and the remaining number becomes a value of 0, reel 36 of P003 is finally used. Like reel 36 on P003, reel 36 that will be finally used in a certain production is referred to as the last reel and is illustrated by a thick frame in FIG. 2. In slot #2, only reel 36 having reel ID Q001 is reserved, reel 36 of Q001 becomes the last reel. That is, when only one reel 36 is used in each slot, that reel 36 becomes the last reel. The last reel can also be referred to as reel 36 that is arranged in each slot when the production of a certain board type ends. In addition, when the production in mounting device 15A1 is completed, the last reel of P003 is planned to be reserved to slot #1 of mounting device 15B1 in mounting line 11B, and the last reel of Q001 is planned to be reserved to slot #2 of mounting device 15B1 (refer to the arrow in the figure).

The description of other reservation information 54a and other slots will be omitted, but the content is the same.

Slot information 55 includes information on feeder 35 (reel 36) mounted in each slot of each mounting device 15. For example, slot information 55 includes the component type, reel ID, the current remaining number of components, information on whether the reel is the last reel, information in an error flag described later, and the like for each slot. In FIG. 3, slot information 55 stored in memory section 53 is illustrated, however, memory section 22 of mounting control section 20 of each mounting device 15 also stores the same slot information 22a regarding each slot of mounting device 15.

Figure 4:
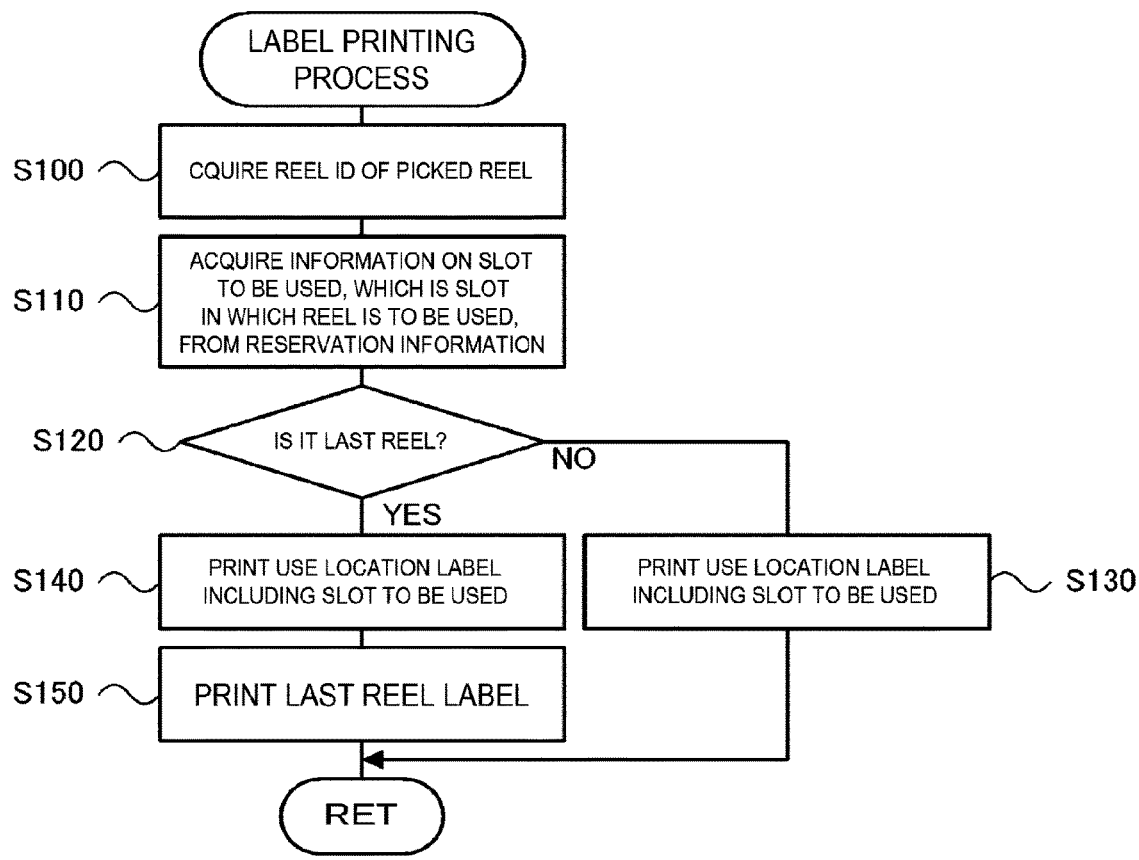
FIG. 4 is a flowchart illustrating an example of a label printing process.

The following is a description of the operation of mounting system 10 configured as above. FIG. 4 is a flowchart illustrating an example of a label printing process. This process is executed by CPU 42 of storage control section 41 when operator M picks reel 36 from reel storage device 40. First, CPU 42 acquires the reel ID of picked reel 36 (S100), and acquires the information on the slot to be used, which is the slot in which reel 36 is scheduled to be used, from reservation information 54a by communicating with management computer 50. (S110). If reel 36 is reserved by multiple reservation information 54a, the information on the slot to be used is acquired from reservation information 54a to be used earliest, and the same will be applied to the subsequent processes. Then, CPU 42 determines whether reel 36 picked this time is the last reel in the slot to be used (S120). If it is determined that the reel is not the last reel, CPU 42 controls label printer 46 to print use location label 38 including the information on the slot to be used (S130), and then, ends the label printing process. The use location label may include information on mounting line 11 and mounting device 15 in which reel 36 is used, the slot number of the slot to be used, and may be a barcode or a two-dimensional code. On the other hand, if it is determined that the reel is the last reel, CPU 42 controls the label printer 46 to print the use location label 38 (S140) and to print last reel label 39 that includes the information on the last reel (S150), and ends the label printing process. CPU 42 may display an instruction to attach each label output from label printer 46 to picked reel 36, on operation panel 44. By operator M attaching these labels to reel 36, it is possible to distinguish the last reel from other reel 36. Use location label 38 and last reel label 39 are not limited to be separate labels, and may be one label.

Figure 5:
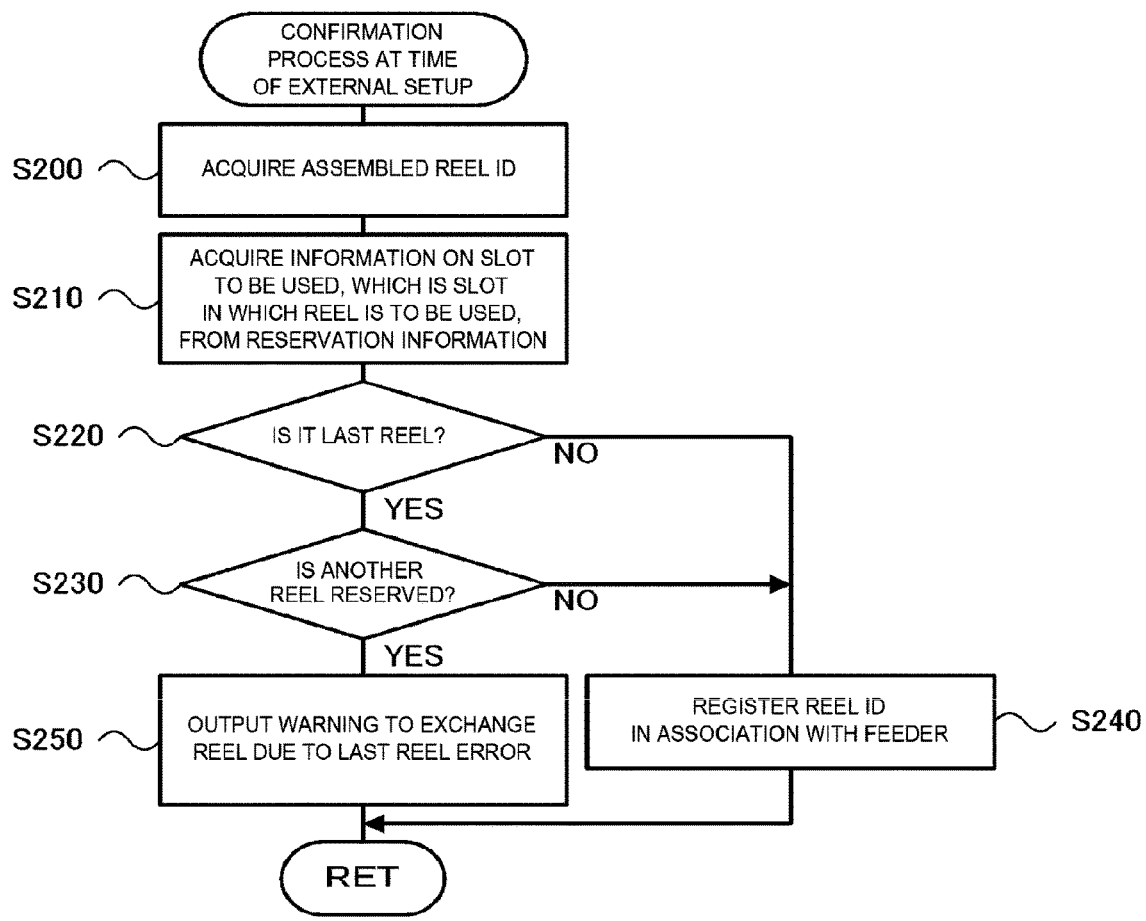
FIG. 5 is a flowchart illustrating an example of a confirmation process when an external setup is performed.

Next, a process when operator M assembles reel 36 to feeder 35 as an external setup will be described. FIG. 5 is a flowchart illustrating an example of a confirmation process at the time of external setup. This process is executed by CPU 52 when operator M causes mobile terminal 18 to read ID label 37 of reel 36 assembled on feeder 35 and the information is notified to management computer 50. First, CPU 52 acquires reel ID of assembled reel 36 (S200), and acquires information on the slot to be used from reservation information 54a (S210). Next, the CPU 52 determines whether assembled reel 36 is the last reel (S220), and whether another reel 36 is reserved to the slot to be used (S230). When it is determined that assembled reel 36 is not the last reel, or when it is determined that no other reel 36 is reserved, CPU 52 registers reel ID of assembled reel 36 in association with feeder 35 (S240), and ends the confirmation process at the time of external setup.

Here, reel 36, which is the last reel and to which no other reel 36 is reserved to the slot to be used, corresponds to reel 36 in Q001 in FIG. 2. Since there is reel 36 that is used first, normally other last reels are not assembled at the time of external setup, but in some cases, operator M may erroneously assemble the last reel. When it is determined in S220 and S230 that the assembled reel is the last reel and another reel 36 is reserved to the slot to be used, CPU 52 outputs a warning to mobile terminal 18 or the like to exchange reel 36 due to the last reel error (S250), and ends the confirmation process at the time of external setup. As a result, even if there is reel 36 used first in the slot to be used, it possible to prevent the last reel from being assembled to feeder 35 to be used from the last reel during external setup.

Figure 6:
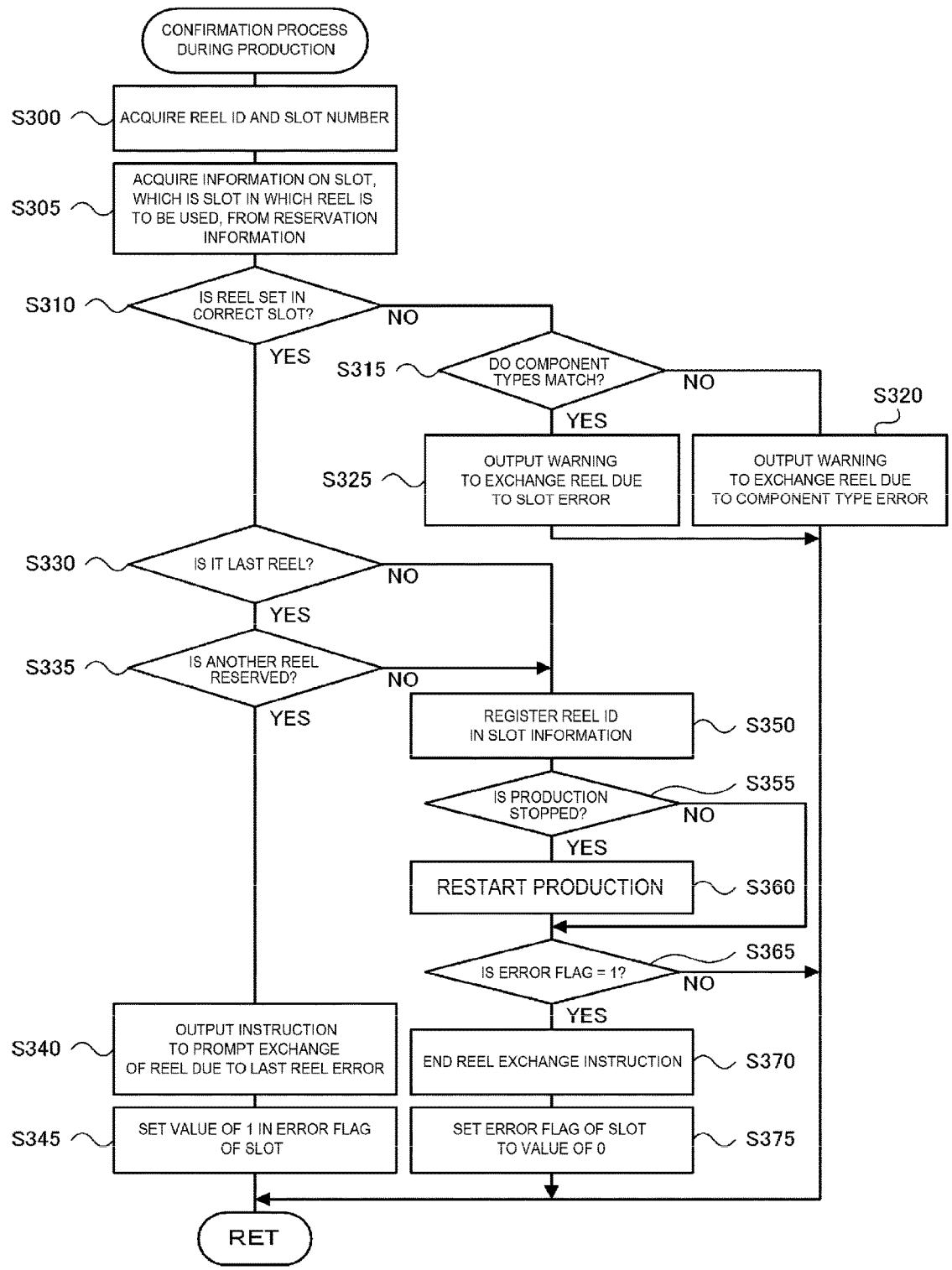
FIG. 6 is a flowchart illustrating an example of a confirmation process during the production.

Subsequently, a process when reel 36 is newly set by exchanging reel 36 or the like during the production will be described. FIG. 6 is a flowchart illustrating an example of a confirmation process during the production. This process is executed by CPU 52 when operator M sets new feeder 35 (reel 36) in the slot during the production or sets new reel 36 in reel 36 near the component shortage, and when the information on new reel 36 is notified to management computer 50. First, CPU 52 acquires a reel ID and a slot number (S300), and acquires information on the slot where reel 36 is to be used from reservation information 54a (S305). Next, CPU 52 determines whether the slot number in which reel 36 is set matches the slot number in reservation information 54a, that is, whether reel 36 is set in the correct slot (S310). When it is determined that reel 36 is not set in the correct slot, CPU 52 determines whether the component type of reel 36 set this time matches the component type of reel 36 to be mounted in the slot (S315). When it is determined that the component types do not match, CPU 52 outputs a warning to mobile terminal 18 or operation panel 30 to exchange reel 36 due to the component type error (S320), and ends the confirmation process during the production. On the other hand, when it is determined that the component types match, CPU 52 outputs a warning to mobile terminal 18 or operation panel 30 to exchange reel 36 due to the slot error (S325), and ends the confirmation process during the production.

As described above, even in the case of reel 36 in which the component types match, when the reel is set in a slot different from the slot to be used, CPU 52 outputs a slot error warning to exchange reel 36. Therefore, as illustrated in FIG. 2, even if any of the component type of slots #1 and #11 in mounting device 15A1 are both component type P, it is possible to prevent reels 36 of P002 and P005 from being replaced with each other. Even if the component types are the same, since the number of components to be supplied may differ if the slot is different, it is possible to prevent a situation in which the number of components to be supplied by the next last reel such as P003 and P006 is also affected, and the remaining number of components in the last reel differs from the expected remaining number of components in reservation information 54a.

In addition, when it is determined in S310 that reel 36 is set in the correct slot, CPU 52 determines whether set reel 36 is the last reel (S330), and whether another reel 36 is reserved to the slot to be used (S335), respectively. When it is determined that the set reel is the last reel and another reel 36 is reserved to the slot to be used, CPU 52 outputs an instruction to mobile terminal 18 or operation panel 30 for prompting the exchange of reel 36 due to the last reel error (S340), and in addition, CPU 52 sets a value of 1 in an error flag indicating that the slot is a last reel error (S345), and ends the confirmation process during the production. A degree of enforcement in the instruction for prompting the exchange in S340 is weaker than that in the output warning for exchange in S250 in FIG. 5 and S320 and S325 in this process. For example, in the warning for exchange, mounting device 15 does not perform the production without exchanging reel 36, but in the instruction for prompting the exchange, it can be supposed that mounting device 15 can perform the production even if reel 36 is not exchanged. For example, in slot information 55 in FIG. 3, since last reel of S003 is set before reel 36 of S002 in slot #2 in mounting device 15B1, it is illustrated that the error flag has a value of 1.

On the other hand, when it is determined that reel 36 set this time is not the last reel, or when it is determined that reel 36 is the last reel and no other reel 36 is reserved, CPU 52 registers the reel ID in association with the slot of slot information 55 (S350), and determines whether the production is currently stopped (S355). Since the production stop is performed by a process described later, the details will be described later. Next, CPU 52 determines whether the error flag of the slot in which reel 36 is set has a value of 1 (S365). When it is determined that the error flag has a value of 1, CPU 52 ends the instruction for prompting the exchange of reel and resets the error flag to a value of 0 (S370, S375), and then, ends the confirmation process during the production. In addition, when it is determined that the error flag is not a value of 0, CPU 52 immediately ends the confirmation process during the production.

Figure 7:
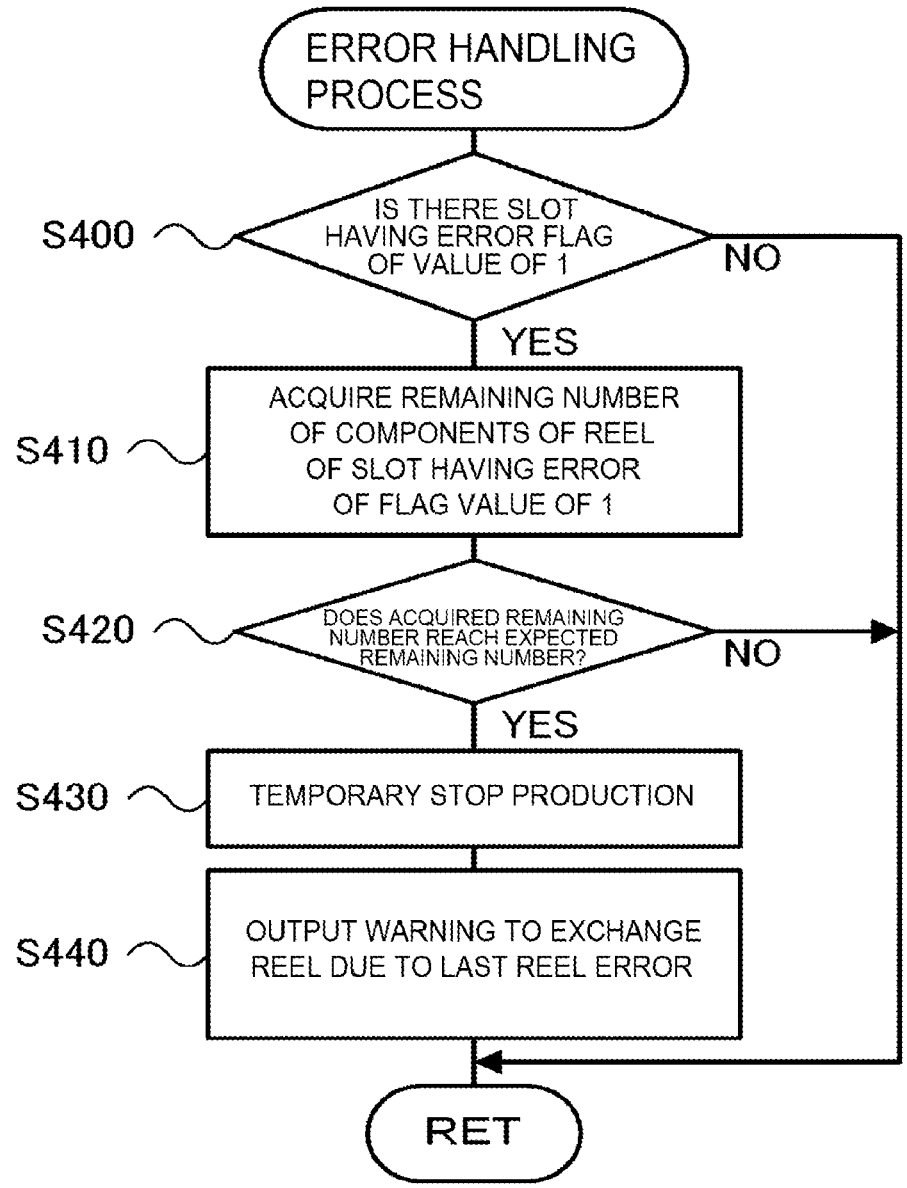
FIG. 7 is a flowchart illustrating an example of an error handling process.

Next, a handling process for the last reel error will be described. FIG. 7 is a flowchart illustrating an example of an error handling process. In this process, first, CPU 52 determines whether there is a slot having an error flag of value of 1 (S400), and when it is determined that there is no slot having an error flag having a value of 1, CPU 52 immediately ends the error handling process. On the other hand, when it is determined that there is a slot having an error flag having a value of 1, CPU 52 acquires the remaining number of components of reel 36 of that slot from slot information 55 (S410), and determines whether the acquired remaining number of components reaches the expected remaining number in reel 36 (S420). The expected remaining number is defined in reservation information 54*a*. When it is determined that the acquired remaining number of components does not reach the expected remaining number, CPU 52 immediately ends the error handling process. On the other hand, when it is determined that the acquired remaining number of components reaches the expected remaining number, CPU 52 temporary stops the production in mounting device 15 in which the last reel error occurs (S430). In addition, CPU 52 outputs a warning to mobile terminal 18 or operation panel 30 to exchange reel 36 due to the last reel error (S440), and ends the error handling process. As described above, CPU 52 allows the production while prompting the exchange up to the expected remaining number even if the last reel error occurs during the production, and does not allow further use of the reel by temporarily stopping the production when reaching the expected remaining number and by outputting the warning for exchange. When operator M exchanges the reel with correct reel 36 according to the warning, CPU 52 executes the confirmation process during the production illustrated in FIG. 6, and determines that reel 36 other than the last reel is set in the correct slot in S310 and S330 and restarts the stopped production (S355 and S360).

Figure 8:
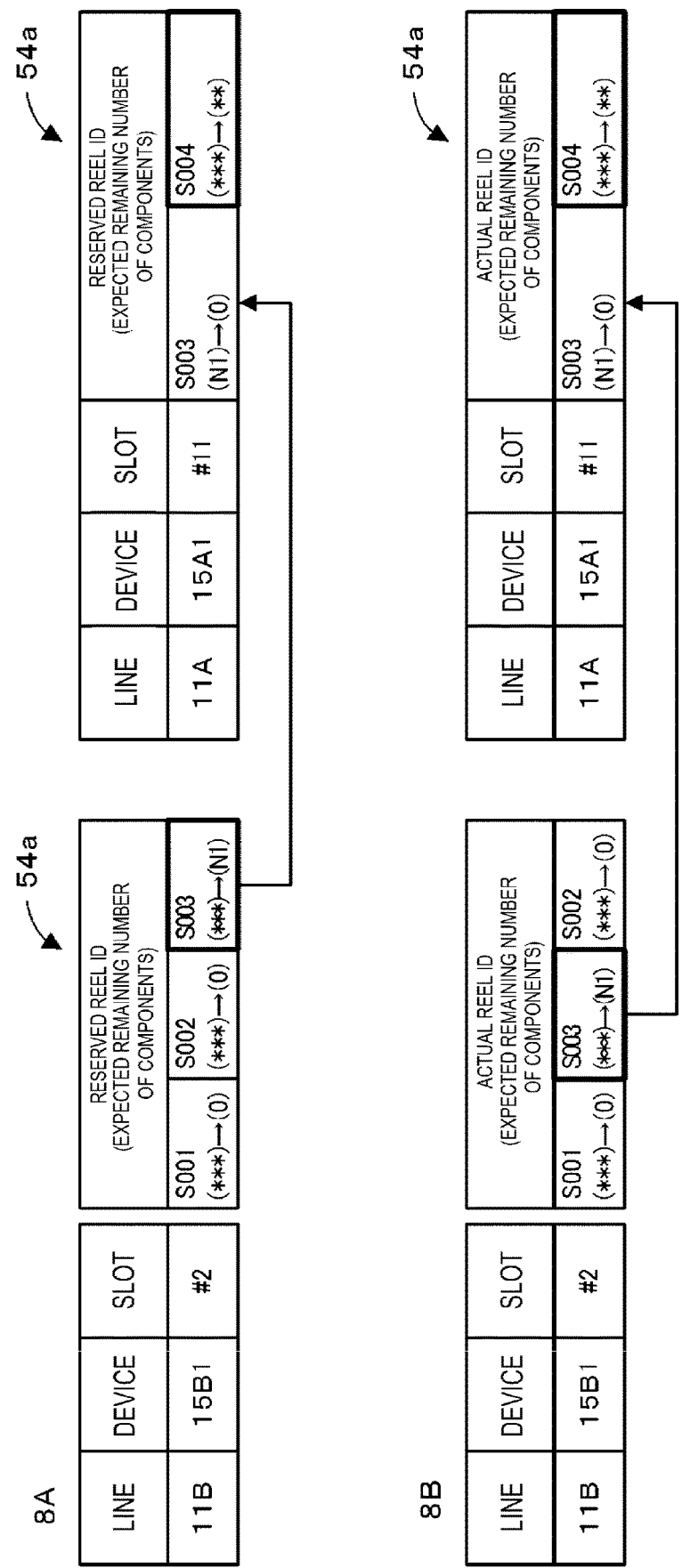
FIG. 8 is an explanatory diagram illustrating an example of error handling.

FIG. 8 is an explanatory diagram illustrating an example of error handling. In reservation information 54*a* in FIG. 8A, in slot #2 of mounting device 15B1, the expected remaining number of last reel S003 is a value N1, and after that, in slot #11 of mounting device 15A1, the components with the remaining number of value N1 are used and reel 36 is expected to be used up. However, in an actual use state, as illustrated in FIG. 8B, the last reel of S003 is set before reel 36 of S002. Therefore, at a timing when the remaining number of components in the last reel of S003 reaches the value N1, it is determined that the remaining number of components reaches the expected remaining number in the error handling process and the warning is output. Since the reel is exchanged with reel 36 of S002 by operator M and the production is restarted, the use of last reel of S003 ends in a state where the remaining number of components is the value N1 as is expected, and can be used in the next production. Therefore, even if the production is continued while prompting the exchange due to the last reel error, the consistency with the reservation information 54*a* can be achieved.

Here, the correspondence relationship between the configuration elements in the present embodiment and the configuration elements of the present disclosure will be clarified. Management computer 50 in the present embodiment corresponds to the management apparatus in the present disclosure, reel 36 corresponds to the accommodation member, memory section 53 corresponds to the memory section, and CPU 52 of management control section 51 corresponds to a management section. In the present embodiment, storage control section 41 of reel storage device 40 is also included in the management apparatus, and CPU 42 is also included in the management section. In addition, mounting device 15 corresponds to the mounting device, and mounting system 10 corresponds to the mounting system.

In mounting system 10 described above, since operator M manages the last reel and other reel 36 in a distinguishable manner, it is possible to suppress operator M from performing erroneous handling such as arranging the last reel before other reel 36, and to prevent that last reel from becoming inconsistent with reservation information 54*a*.

In addition, when picking the last reel, since last reel label 39 is printed and attached to the last reel, operator M can easily recognize the last reel. Furthermore, when the last reel is assembled to feeder 35 first during the external setup, since the warning of last reel error is output, it is possible to prevent the last reel from being used first. Then, when the last reel is set before other reel 36 during the production, since the reel exchange is prompted, operator M can recognize that the last reel is erroneously set and can exchange the reel with correct reel 36. In addition, since the last reel that is set erroneously can be used up to the expected remaining number in reservation information 54*a*, and the warning is output to exchange the reel when the remaining number of components reaches the expected remaining number, it is possible to prevent inconsistency with reservation information 54*a*.

The present disclosure is not limited to the above-described embodiment, and may be implemented in various aspects without departing from the technical scope of the present disclosure.

For example, in the embodiment described above, a display management process for causing operator M to attach printed last reel label 39 to the last reel is performed when picking the last reel, however, the configuration is not limited to this. For example, operator M may be caused to attach a seal or the like that serves as a mark of the last reel, or operator M may be instructed to handwrite the effect of being the last reel.

In the embodiment described above, the display management process for displaying the effect of being the last reel is performed at the time of picking, the warning is output when the last reel is assembled to feeder 35 during the external setup, and the exchange is prompted when the last reel is set during the production, however, the configuration is not limited to this. That is, not limited to performing the management process for the last reel in any case of picking, external setup, and during the production, the management process for the last reel is only needed to be performed at any one of the cases. In addition, operator M sets feeder 35 (reel 36) in the slot of mounting device 15 as an example, however, the configuration is not limited to this, an unmanned conveyance vehicle such as a loader that can automatically convey feeder 35 may set the feeder in the slot of mounting device 15. In that case, when feeder 35 to be conveyed is mounted on the unmanned conveyance vehicle, whether the feeder is the last reel is only needed to be confirmed.

Figure 9:
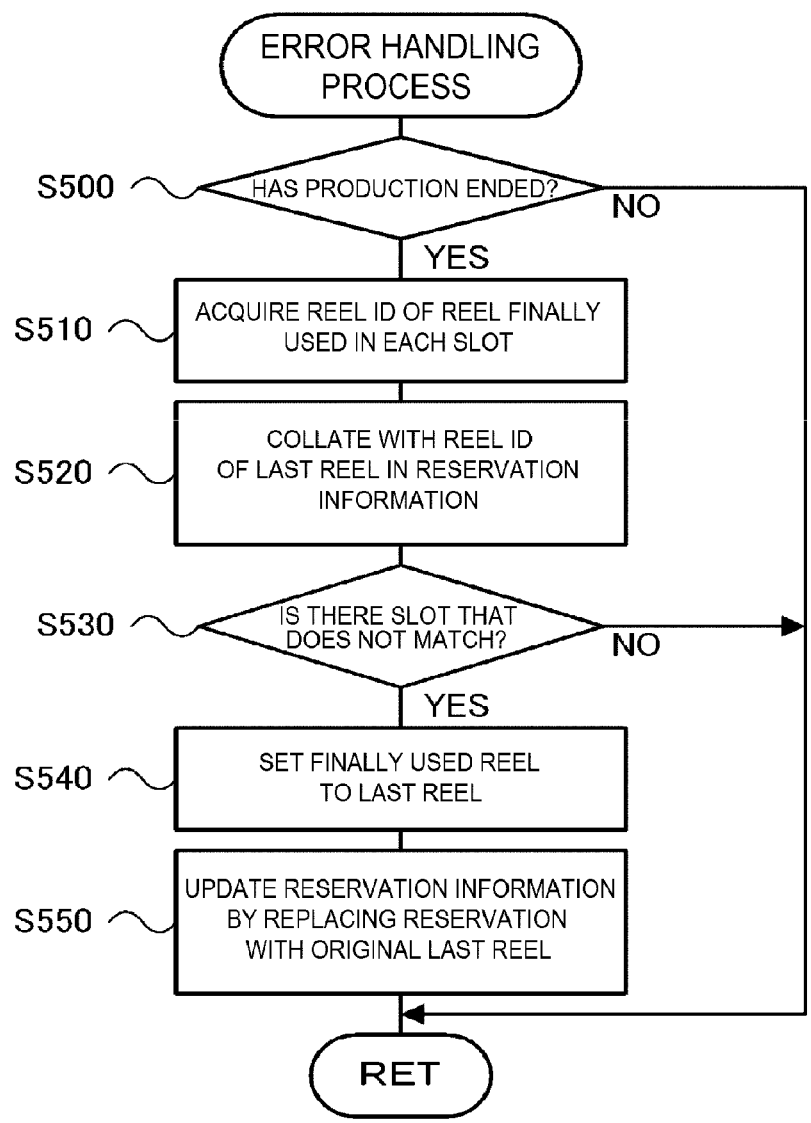
FIG. 9 is a flowchart illustrating an error handling process in a modification example.
Figure 10:
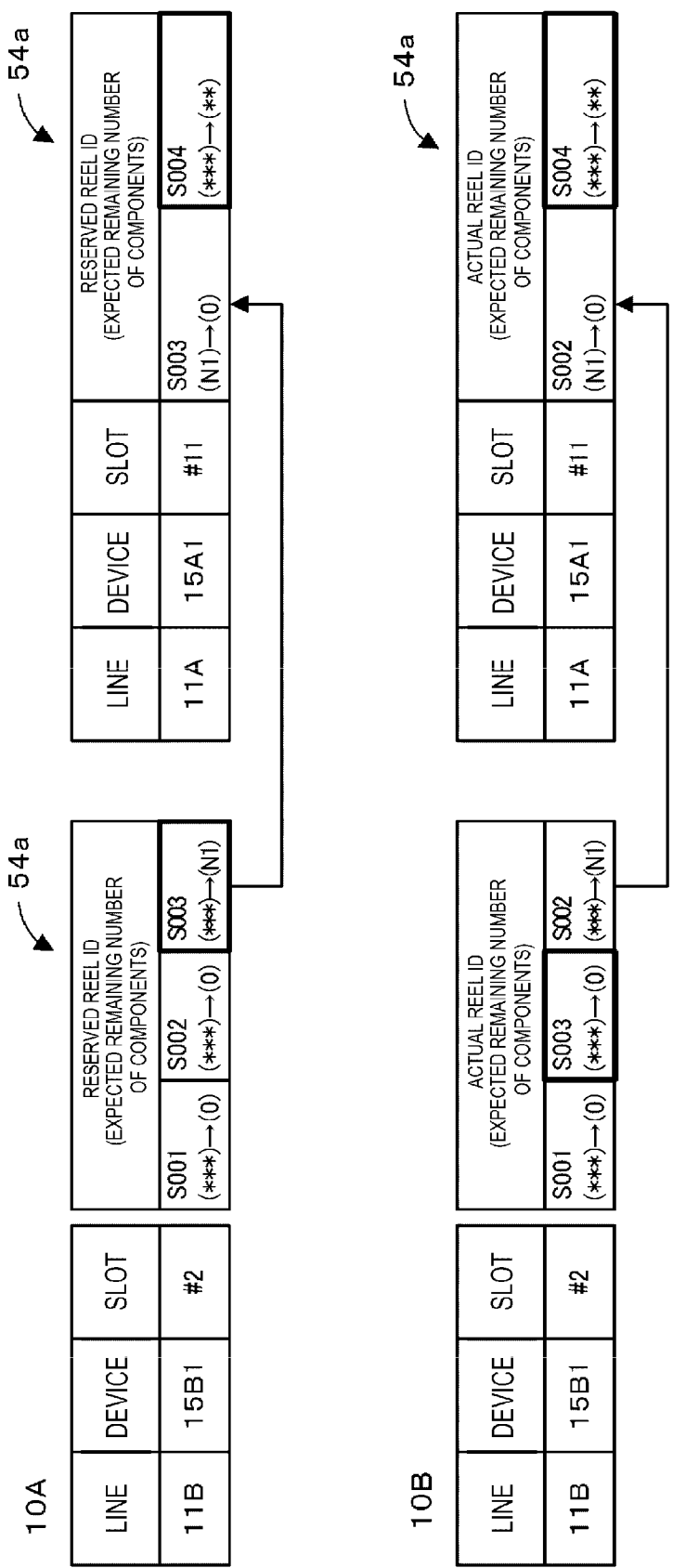
FIG. 10 is an explanatory diagram illustrating an error handling in the modification example.

In the embodiment described above, reel 36 set during the production can be used up to the expected remaining number in the case of the last reel error, however, the configuration is not limited to this. FIG. 9 is a flowchart illustrating an error handling process in a modification example and FIG. 10 is an explanatory diagram illustrating the error handling in the modification example. In this error handling process, first, CPU 52 determines whether the production has ended (S500), and ends the error handling process when it is determined that the production has not ended. On the other hand, when it is determined that the production has ended, CPU 52 acquires the reel ID of each reel 36 finally used in each slot from slot information 55 (S510). Next, CPU 52 collates each acquired reel ID with the reel ID of the last reel in reservation information 54*a* (S520), and determines whether there is a slot that does not match (S530). When it is determined that there is no slot that does not match, CPU 52 ends the error handling process. On the other hand, when it is determined that there is a slot that does not match, CPU 52 sets the finally used reel 36 (reel ID) to the last reel (S540), updates the reservation information 54*a* by replacing the assignment with the original last reel (S550), and ends the error handling process. FIG. 10A illustrates the same reservation information 54*a* as in FIG. 8A. On the other hand, FIG. 10B illustrates a case where the last reel of original P003 is used up first, and then reel 36 of P002 is used, and then, the production ends. In this case, CPU 52 updates reservation information 54*a* such that P002 becomes the last reel. Therefore, in the next production, P002 will be used in slot #11 of mounting device 15A1. As described above, in the modification example, since CPU 52 updates reservation information 54*a* matching to the actual use state, it is possible to prevent the inconsistency with reservation information 54*a*.

Figure 11:
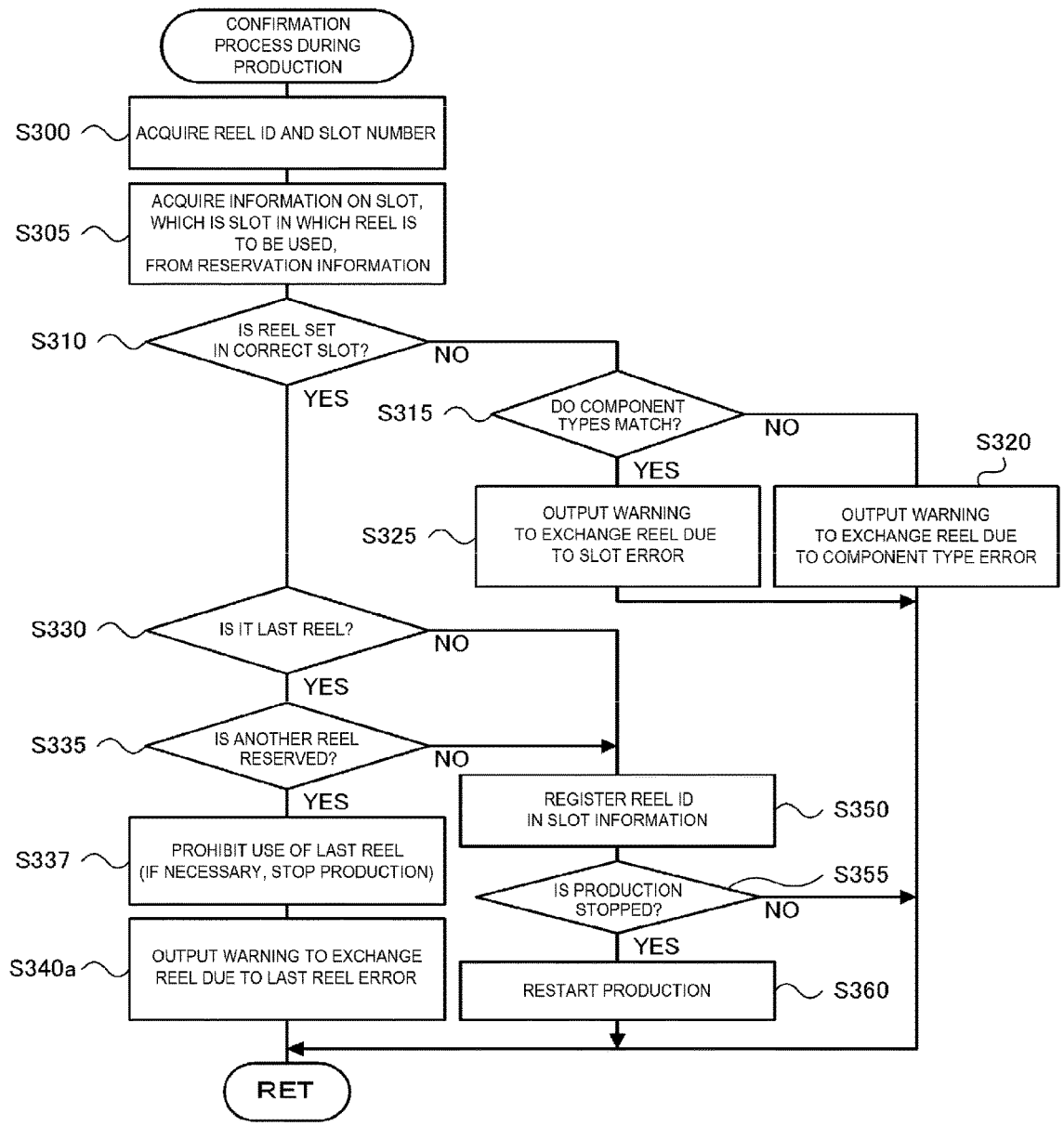
FIG. 11 is a flowchart illustrating a confirmation process during the production in the modification example.

In addition, FIG. 11 is a flowchart illustrating a confirmation process during the production in the modification example. In FIG. 11, the same step number will be given to the process same as in FIG. 6, and the description thereof will be omitted. When it is determined in S330 and S335 that the set reel 36 is the last reel and another reel 36 is reserved to the slot to be used, CPU 52 prohibits the use of the last reel (S337), outputs a warning to exchange reel 36 due to the last reel error (S340*a*), and ends the confirmation process during the production. In S337, if necessary, the use of the last reel may be surely prohibited by stopping the production of mounting device 15. In this way, it is possible to surely prevent the last reel from being used first.

In the embodiment described above, when reel 36 having the same component type but different slot to be used is set, the slot error is notified and the warning is output, however, the configuration is not limited to this. For example, it may be allowed to be used up to the expected remaining number of reel 36, or it may be handled by updating reservation information 54*a* as in the modification example.

In the embodiment described above, even when only one reel 36 is used in each slot, reel 36 is managed as the last reel, but not limited to this, it may be managed in such a manner that final reel 36 is used as the last reel only when multiple reels 36 are used in each slot.

Here, the management apparatus in the present disclosure may be configured as follows. In the management apparatus in the present disclosure, when the operator takes out the accommodation member from a storing section that stores the accommodation member, the management section may execute a display management process for displaying information indicating that the taken out accommodation member is the final accommodation member on the final accommodation member if the final accommodation member is taken out, and may omit the execution of the display management process if other accommodation member is taken out. In this way, since the operator can easily recognize the final accommodation member and other accommodation members, the accommodation members in which the components are expected to remain can be managed more properly.

In the management apparatus in the present disclosure, when the operator prepares for the production of the board, if the final accommodation member is prepared to be arranged before other accommodation members, the management section may output a warning to arrange the accommodation member from other accommodation members. In this way, it is possible to prevent the final accommodation member from being used first.

In the management apparatus in the present disclosure, when the production of the board is performed, if the final accommodation member is arranged at each arrangement position before other accommodation members, the management section may notify to exchange with other accommodation members at the arrangement position. In this way, it is possible to make the operator recognize that the final accommodation member is erroneously arranged first and prompt the exchange.

In the management apparatus in the present disclosure, when the production of the board is performed, if the final accommodation member is arranged at each arrangement position before other accommodation members, the management section may assume that components in the final accommodation member can be used up to the expected remaining number of components in the reservation information, and may output a warning to exchange with other accommodation members at the arrangement position when reaching the expected remaining number. In this way, since the final accommodation member will not be used exceeding the expected remaining number of components, it is possible to prevent the inconsistency with the reservation information.

In the management apparatus in the present disclosure, when the production of the board is performed, if the final accommodation member is arranged at each arrangement position before other accommodation members, the management section may output a warning to prohibit the use of the final accommodation member and exchange with other accommodation members at the arrangement position. In this way, it is possible to surely prevent the final accommodation member from being used first.

In the management apparatus in the present disclosure, when the production of the board is performed, if the accommodation member is arranged whose identification information is different from that of the accommodation member reserved to each arrangement position, the management section may output a warning that the arrangement position is different even if the accommodation member is of the same component type. Here, even if the accommodation member is of the same component type, when the arrangement position is different, since the used number of components normally changes, the remaining number of components after use will become different. Therefore, by outputting a warning even when the accommodation member is of the same component type, it is possible to prevent the inconsistency with the reservation information.

In the management apparatus in the present disclosure, when the production of the board is ended, if there is an accommodation member different from the final accommodation member in the accommodation member arranged at each arrangement position, the management section may change the reservation information such that the different accommodation member becomes the final accommodation member. In this way, since the reservation information can be matched to the actual use state, it is possible to prevent the inconsistency with the reservation information.

A mounting system in the present disclosure includes: a mounting device configured to pick up components accommodated in an accommodation member and mounts the components on a board; and the management apparatus according to any one of those described above. In this mounting system, similarly to the management apparatus described above, it is possible to properly manage the accommodation members in which the components are expected to remain.

Here, the management apparatus for an accommodation member that accommodates components to be mounted on a board by a mounting device may include: a memory section configured to reserve identification information on the accommodation member required for a production of the board to each arrangement position of the accommodation member in the mounting device, and to store reservation information defining an order of use of multiple accommodation members at the same arrangement position according to the number of components required for each production; and a management section configured to manage the accommodation member so as can be distinguished by the operator based on the identification information on the accommodation member. If the accommodation member is arranged whose identification information is different from that of the accommodation member reserved to each arrangement position, the management section may output a warning that the arrangement position is different even if the accommodation member is of the same component type. That is, if the accommodation member of the same component type but the arrangement position is different, a warning may be output without managing whether the accommodation member is the final accommodation member. In such a case, CPU 52 needs only to omit S120, S140, and S150 in the label printing process in FIG. 4. In addition, CPU 52 needs only to determine whether correct reel 36 is set instead of executing S220 in the confirmation process at the time of the external setup illustrated in FIG. 5, and if correct, needs only to execute S240, and if not correct, a warning needs only to be output to exchange the reel instead of executing S230 and S240 because reel 36 is incorrect. In addition, CPU 52 needs only to omit S330 to S375 in FIG. 6 in the confirmation process during the production and omit the error handling process in FIG. 7.

INDUSTRIAL APPLICABILITY

The present disclosure can be used in an industry for manufacturing mounting systems and the like.

REFERENCE SIGNS LIST 10 mounting system, 11 mounting line, 12 network, 13 printing device, 14 printing inspection device, 15 mounting device, 16 mounting inspection device, 18 mobile terminal, 19 preparation area, 20 mounting control section, 21 CPU, 22 memory section, 22a slot information, 23 conveyance section, 24 supply section, 25 mounting section, 26 head moving section, 27 mounting head, 28 suction nozzle, 29 communication section, 30 operation panel, 35 feeder, 36 reel, 37 ID label, 38 use location label, 39 last reel label, 40 reel storage device, 41 storage control section, 42 CPU, 43 memory section, 44 operation panel, 45 gate, 46 label printer, 50 management computer, 51 management control section, 52 CPU, 53 memory section, 54 production plan information, 54a reservation information, 55 slot information, 56 communication section, 57 display section, 58 input section, M operator

The invention claimed is:

1. A management apparatus for accommodation members that accommodate components to be mounted on a board by a mounting device, the management apparatus comprising:
a memory section configured to store identification information of the accommodation members required for a production of the board, an arrangement position of each of the accommodation members among a plurality of arrangement positions in the mounting device for the production of the board, and reservation information defining an order of use of the accommodation members at each of the arrangement positions for the production of the board according to a number of components required for the production; and
a management section configured to
set one of the accommodation members scheduled to be last used at the arrangement position when the production of the board ends based on the reservation information as a final accommodation member, and
when an operator takes out an accommodation member from a storing section that stores the accommodation members, the management section determines if the accommodation member being taken from the storing section is the final accommodation member, and when it is determined that the final accommodation member is taken out, the management section executes a display management process for displaying on a display information indicating that the accommodation member being taken from the storing section is the final accommodation member.

2. The management apparatus according to claim 1, wherein the management section omits execution of the display management process if other accommodation members other than the final accommodation member are taken out from the storing section.

3. The management apparatus according to claim 2, wherein, when the operator prepares for the production of the board the management section outputs a warning to arrange the final accommodation member away from the other accommodation members.

4. The management apparatus according to claim 2, wherein, when the production of the board is performed, if the final accommodation member is arranged at one of the arrangement positions before the other accommodation members, the management section provides a notification to exchange the final accommodation member with the other accommodation members at the arrangement position.

5. The management apparatus according to claim 2, wherein, when the production of the board is performed, if the final accommodation member is arranged at one of the arrangement positions before the other accommodation members, the management section assumes that components in the final accommodation member can be used up to an expected remaining number of components in the reservation information, and outputs a warning to exchange the final accommodation member with the other accommodation members at the arrangement position when a remaining number of components in the final accommodation member reaches the expected remaining number.

6. The management apparatus according to claim 2, wherein, when the production of the board is performed, if the final accommodation member is arranged at one of the arrangement positions before the other accommodation members, the management section outputs a warning to prohibit use of the final accommodation member and exchange the final accommodation member with the other accommodation members at the arrangement position.

7. The management apparatus according to claim 1, wherein, when the production of the board is performed, if any of the accommodation members are arranged in the accommodation positions in the mounting device whose identification information is different from that of the accommodation member reserved to each of the arrangement positions, the management section outputs a warning indicating that the arrangement position of the accommodation member is different even if the accommodation member is of the same component type as the accommodation member reserved to that arrangement position.

8. The management apparatus according to claim 1, wherein, when the production of the board is ended, if there is a different accommodation member of the accommodation members different from the final accommodation member at any of the arrangement positions, the management section changes the reservation information such that the different accommodation member is set as the final accommodation member for that arrangement position.

9. A mounting system comprising:
the management apparatus according to claim 1, and
the mounting device configured to pick up the components accommodated in the accommodation members and mount the components on the board.

* * * * *